United States Patent
Sugibayashi et al.

(10) Patent No.: US 7,948,783 B2
(45) Date of Patent: May 24, 2011

(54) MRAM

(75) Inventors: Tadahiko Sugibayashi, Tokyo (JP); Takeshi Honda, Tokyo (JP); Noboru Sakimura, Tokyo (JP); Nobuyuki Ishiwata, Tokyo (JP); Shuichi Tahara, Tokyo (JP)

(73) Assignee: NEC Corporation, Tokyo (JP)

( * ) Notice: Subject to any disclaimer, the term of this patent is extended or adjusted under 35 U.S.C. 154(b) by 130 days.

(21) Appl. No.: 12/515,898

(22) PCT Filed: Nov. 12, 2007

(86) PCT No.: PCT/JP2007/071922
§ 371 (c)(1),
(2), (4) Date: Jul. 1, 2009

(87) PCT Pub. No.: WO2008/062686
PCT Pub. Date: May 29, 2008

(65) Prior Publication Data
US 2010/0046284 A1    Feb. 25, 2010

(30) Foreign Application Priority Data
Nov. 24, 2006   (JP) .................................. 2006-317207

(51) Int. Cl.
G11C 15/02    (2006.01)

(52) U.S. Cl. ................. 365/50; 365/53; 365/189.09

(58) Field of Classification Search ............... 365/50, 365/53, 189.09
See application file for complete search history.

(56) References Cited

U.S. PATENT DOCUMENTS
7,068,535 B2 * 6/2006 Johnson ............... 365/170

FOREIGN PATENT DOCUMENTS
| JP | 1995219853 A | 8/1995 |
| JP | 2005086015 A | 3/2005 |
| JP | 2006511892 A | 4/2006 |
| JP | 2006511936 A | 4/2006 |
| JP | 2006134363 A | 5/2006 |

OTHER PUBLICATIONS

International Search Report for PCT/JP2007/071922 mailed Feb. 12, 2008.

* cited by examiner

Primary Examiner — Huan Hoang
Assistant Examiner — Jason Lappas

(57) ABSTRACT

An MRAM comprises: a plurality of magnetic memory cells each having a magnetoresistive element; and a magnetic field application section. The magnetic field application section applies an offset adjustment magnetic field in a certain direction to the plurality of magnetic memory cells from outside the plurality of magnetic memory cells. Respective data stored in the plurality of magnetic memory cells become the same when the offset adjustment magnetic field is removed.

11 Claims, 10 Drawing Sheets

10: MAGNETIC MEMORY CELL (MAGNETORESISTIVE ELEMENT)

MRAM

TECHNICAL FIELD

The present invention relates to a semiconductor memory. In particular, the present invention relates to a magnetic random access memory (MRAM) that uses a magnetoresistive element as a memory cell.

BACKGROUND ART

In a field of information technology, preventing leak of confidential information is of extreme importance. For example, a secret key used for data encryption is extremely important information, and a serious situation would result if it is stolen. The secret key is written and stored in, for example, a flash memory in a system LSI. Once written, a user usually cannot read out the secret key. However, there appeared some people who try to make unfair profits by unpacking an LSI package and detecting charge amount accumulated in a floating gate based on electric field distribution.

Japanese Laid-Open Patent Application JP-H07-219853 discloses a terminal device that can detect fraudulent access. The terminal device detects that a case is opened and then judges whether it is fraudulent disassembling by malicious third party or not. If it is determined to be fraudulent disassembling, the terminal device destroys confidential information stored in an installed EEPROM or SRAM.

The theft of confidential information is also possible in a case of an MRAM. The MRAM is a nonvolatile semiconductor memory that is promising in terms of high integration and high-speed operation. In the MRAM, a magnetoresistive element that exhibits "magnetoresistance effect" such as TMR (Tunnel MagnetoResistance) effect is used as a memory cell (refer to, for example, Japanese Laid-Open Patent Application JP-2005-86015 and JP-2006-134363).

FIG. 1 is a side view schematically showing a structure of a typical memory cell (magnetoresistive element) 110 of an MRAM. The memory cell 110 is provided with a magnetic pinned layer 120, a magnetic free layer 130 and a tunneling insulating layer 140. The tunneling insulating layer 140 is sandwiched between the magnetic pinned layer 120 and the magnetic free layer 130, and thus the magnetic pinned layer 120, the magnetic free layer 130 and the tunneling insulating layer 140 form an MTJ (Magnetic Tunnel Junction).

The magnetic free layer 130 is formed of ferromagnetic material and its magnetization direction is reversible. Although the magnetic pinned layer 120 also includes ferromagnetic material, its magnetization direction is fixed. More specifically, the magnetic pinned layer 120 has a synthetic ferrimagnetic structure consisting of a ferromagnetic film (first ferromagnetic film) 121, a ferromagnetic film (second ferromagnetic film) 122, a nonmagnetic film 123 and an antiferromagnetic film 124. The ferromagnetic film 122 is formed on the antiferromagnetic film 124, and the ferromagnetic film 121 is formed on the ferromagnetic film 122 through the nonmagnetic film 123. That is, the nonmagnetic film 123 is sandwiched between the ferromagnetic films 121 and 122. The ferromagnetic film 121 is in contact with the above-mentioned tunneling insulating layer 140. A magnetization direction of the ferromagnetic film 122 is fixed by the antiferromagnetic film 124. The ferromagnetic film 121 is antiferromagnetically coupled to the ferromagnetic film 122 across the nonmagnetic film 123 and thus its magnetization direction is fixed. Although the ferromagnetic film 121 and the ferromagnetic film 122 are opposite in the magnetization direction, their thicknesses are the same.

In the memory cell 110 thus constructed, two states are possible: an anti-parallel state in which magnetization directions of the magnetic free layer 130 and the ferromagnetic film 121 are anti-parallel to each other; and a parallel state in which the magnetization directions are parallel to each other. It is known that a resistance value $(R+\Delta R)$ of the MTJ in the anti-parallel state becomes larger than a resistance value $(R)$ in the parallel state, due to the magnetoresistance effect. The memory cell 110 nonvolatilely stores data by utilizing the change in the resistance value. For example, the anti-parallel state is related to data "1" and the parallel state is related to data "0".

Data rewriting is achieved by switching the magnetization direction of the magnetic free layer 130. For example, a write magnetic field generated by a predetermined write current is applied to the memory cell 110 and thereby the magnetization direction of the magnetic free layer 130 is reversed. Data reading is achieved based on magnitude of a tunneling current flowing through the MTJ. For example, in the case of data "1" (anti-parallel state), the resistance value of the MTJ is comparatively large and the tunneling current becomes comparatively small. On the other hand, in the case of data "0" (parallel state), the resistance value of the MTJ is comparatively small and the tunneling current becomes comparatively large. It is therefore possible to determine whether the data stored in the memory cell 110 is "1" or "0" by comparing the tunneling current with a predetermined threshold value.

In the case of the memory cell 110 of the MRAM, as described above, the data is determined by the magnetization direction of the magnetic free layer 130. Here, the magnetic free layer 130 generates a leak magnetic field, although it is weak. Therefore, as in the case of the above-mentioned flash memory, the data stored in the memory cells 110 can be externally read out by the use of a magnetometer. If important confidential information is stored in the memory cells 110, the confidential information may be stolen fraudulently.

DISCLOSURE OF INVENTION

As described above, in the case of the MRAM, there is a possibility that the confidential information is stolen through an analysis of internal magnetic field distribution. Since the analysis of magnetic field distribution is easier than an analysis of charge amount or electric field distribution, the data theft is at greater risk. It is therefore important to take effective measures against the data theft with respect to the MRAM.

An object of the present invention is to provide an MRAM in which measures against the data theft are taken.

An object of the present invention is to provide an MRAM having high reliability in terms of maintenance of confidentiality.

An MRAM according to the present invention comprises: a plurality of magnetic memory cells each having a magnetoresistive element; and a magnetic field application section. The magnetic field application section applies an offset adjustment magnetic field in a certain direction to the plurality of magnetic memory cells from outside the plurality of magnetic memory cells. Respective data stored in the plurality of magnetic memory cells become the same when the offset adjustment magnetic field is removed.

In the MRAM according to the present invention, data retention just by magnetic bodies within the magnetic memory cells is impossible or unstable. Data stored in the magnetic memory cells are stabilized by the offset adjustment magnetic field applied by the magnetic field application section. Therefore, if the MRAM is disassembled for the purpose of fraudulently stealing the data stored in the magnetic memory cells, the offset adjustment magnetic field is not applied and hence the data stored in the plurality of magnetic memory cells are destroyed. That is to say, the data theft is prevented. In this manner, reliability of confidentiality is improved according to the MRAM of the present invention.

According to the MRAM of the present invention, all data stored in the magnetic memory cells become the same if the MRAM is disassembled for the purpose of fraudulently stealing the data stored in the magnetic memory cells. That is to say, the data are destroyed and thus the data theft is prevented. Consequently, the reliability of confidentiality is improved.

BEST MODE FOR CARRYING OUT THE INVENTION

An MRAM according to an embodiment of the present invention will be described below with reference to the attached drawings. The MRAM according to the present embodiment is installed, for example, in a system LSI or an information system.

1. First Embodiment 1-1. Structure and Operation

Figure 1:
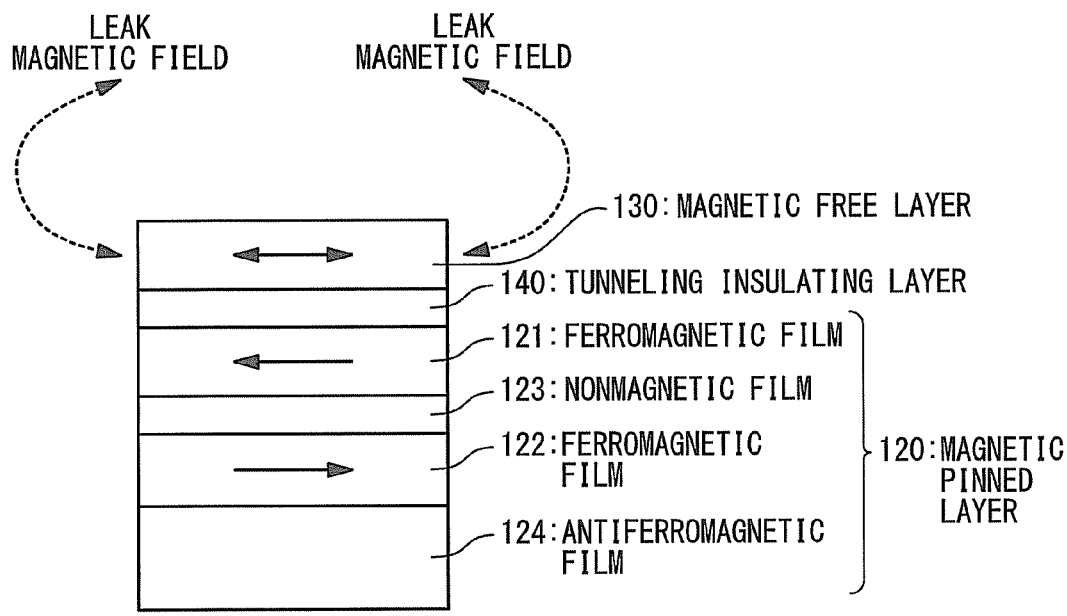
FIG. 1 is a side view showing a structure of a typical magnetoresistive element.
Figure 2:
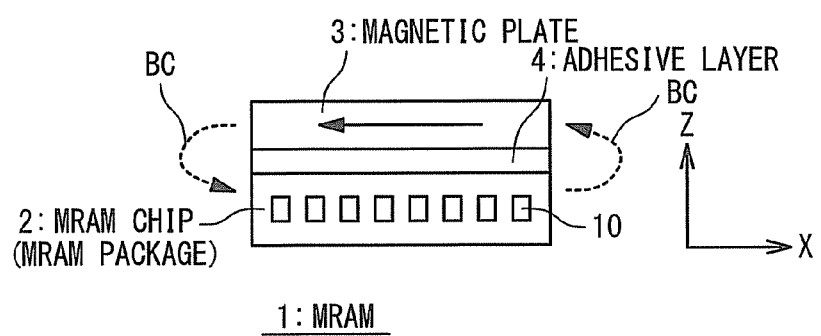
FIG. 2 is a side view showing a structure of an MRAM according to a first embodiment of the present invention.

FIG. 2 is a side view showing a structure of an MRAM 1 according to a first embodiment of the present invention. The MRAM 1 according to the present embodiment is provided with a MRAM chip 2 and a magnetic plate 3. A plurality of magnetic memory cells 10 are formed in the MRAM chip 2.

Each magnetic memory cell 10 has a magnetoresistive element. In FIG. 2, a direction perpendicular to a surface of the MRAM chip 2 is expressed by a Z direction, and one direction perpendicular to the Z direction is expressed by an X direction.

The magnetic plate 3 is provided outside the MRAM chip 2 and attached on the surface of the MRAM chip 2 through an adhesive layer 4. That is to say, the magnetic plate 3 is attached on the surface of the MRAM chip 2, before the MRAM chip 2 is packaged. Alternatively, the magnetic plate 3 may be attached on an MRAM package provided with the MRAM chip 2. In this case, the magnetic plate 3 is attached on a surface of the MRAM package through an adhesive layer 4, after the MRAM chip 2 is packaged.

The magnetic plate 3 is formed of ferromagnetic material and has magnetization. In FIG. 2, for example, the magnetic plate 3 has magnetization in −X direction. Therefore, the magnetic plate 3 uniformly applies a magnetic field BC in a certain direction to the MRAM chip 2, namely the plurality of magnetic memory cells 10. In the case of FIG. 2, the magnetic field BC in the +X direction is applied to the plurality of magnetic memory cells 10.

Figure 3:
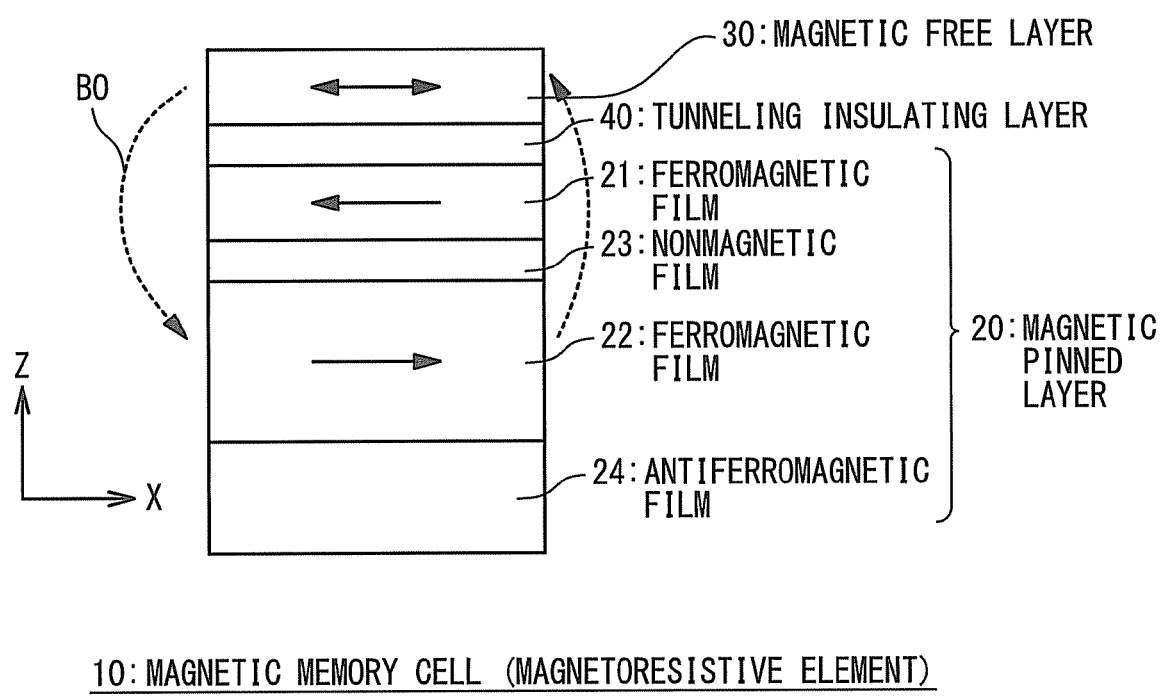
FIG. 3 is a side view showing a structure of a magnetic memory cell (magnetoresistive element) according to the first embodiment of the present invention.

FIG. 3 is a side view showing a structure of the magnetic memory cell 10 (magnetoresistive element) according to the present embodiment. The magnetic memory cell 10 is provided with a magnetic pinned layer 20, a magnetic free layer 30 and a tunneling insulating layer 40 that are stacked in the Z direction.

The magnetic pinned layer 20 includes ferromagnetic material and its magnetization direction is fixed. More specifically, the magnetic pinned layer 20 has a synthetic ferrimagnetic structure consisting of a ferromagnetic film (first ferromagnetic film) 21, a ferromagnetic film (second ferromagnetic film) 22, a nonmagnetic film 23 and an antiferromagnetic film 24. The ferromagnetic films 21 and 22 are CoFe films, for example. The nonmagnetic film 23 is a Ru film, for example. The antiferromagnetic film 24 is a PtMn film, for example. The ferromagnetic film 22 is formed on the antiferromagnetic film 24, and the ferromagnetic film 21 is formed on the ferromagnetic film 22 through the nonmagnetic film 23. That is, the nonmagnetic film 23 is sandwiched between the ferromagnetic films 21 and 22. The ferromagnetic film 21 is in contact with the tunneling insulating layer 140. A magnetization direction of the ferromagnetic film 22 is fixed by the antiferromagnetic film 24. The ferromagnetic film 21 is antiferromagnetically coupled to the ferromagnetic film 22 across the nonmagnetic film 23 and thus its magnetization direction is fixed. In FIG. 3, for example, the magnetization of the ferromagnetic film 21 is fixed to the −X direction, and the magnetization of the ferromagnetic film 22 is fixed to the +X direction.

The magnetic free layer 30 is formed of ferromagnetic material such as NiFe, CoFe and NiFeCo. A magnetization direction of the magnetic free layer 30 is reversible. In FIG. 3, the magnetization direction of the magnetic free layer 30 is allowed to be the +X direction or the −X direction, namely, to be parallel or anti-parallel to the magnetization direction of the above-described ferromagnetic film 21.

The tunneling insulating layer 40 is sandwiched between the magnetic pinned layer 20 and the magnetic free layer 30. The tunneling insulating layer 40 is a nonmagnetic layer. For example, the tunneling insulating layer 40 is a thin $Al_2O_3$ layer. The magnetic pinned layer 20, the magnetic free layer 30 and the tunneling insulating layer 40 form an MTJ.

In the memory cell 10 thus constructed, two states are possible: an anti-parallel state in which the magnetization directions of the magnetic free layer 30 and the ferromagnetic film 21 are anti-parallel to each other; and a parallel state in which the magnetization directions are parallel to each other. A resistance value (R+ΔR) of the MTJ in the anti-parallel state becomes larger than a resistance value (R) in the parallel state, due to the magnetoresistance effect. The memory cell 10 nonvolatilely stores data by utilizing the change in the resistance value. For example, the anti-parallel state is related to data "1" and the parallel state is related to data "0".

Data rewriting is achieved by switching the magnetization direction of the magnetic free layer 30. For example, a write magnetic field generated by a predetermined write current Iw is applied to the memory cell 10 and thereby the magnetization direction of the magnetic free layer 30 is reversed. Data reading is achieved based on magnitude of a tunneling current Ir flowing through the MTJ. For example, in the case of data "1" (anti-parallel state), the resistance value of the MTJ is comparatively large and the tunneling current Ir becomes comparatively small. On the other hand, in the case of data "0" (parallel state), the resistance value of the MTJ is comparatively small and the tunneling current Ir becomes comparatively large. It is therefore possible to determine whether the data stored in the memory cell 10 is "1" or "0" by comparing the tunneling current Ir with a predetermined threshold value.

1-2. Principle of Maintenance of Confidentiality

The magnetic memory cell 10 according to the present embodiment has the following features. As shown in FIG. 3, the ferromagnetic film 21 and the ferromagnetic film 22 are asymmetric, and a thickness of the ferromagnetic film 22 is larger than a thickness of the ferromagnetic film 21 in the Z direction. As a result, a leak magnetic field from the magnetic pinned layer 20 has a certain magnitude and the leak magnetic field is applied to the magnetic free layer 30. The leak magnetic field thus applied to the magnetic free layer 30 is hereinafter referred to as an "offset magnetic field BO". According to the present embodiment, the leak magnetic field from the magnetic pinned layer 20 is applied as the offset magnetic field BO to the magnetic free layer 30.

As shown in FIG. 3, a direction of the offset magnetic field BO applied to the magnetic free layer 30 is the −X direction. This direction is opposite to the direction (+X direction) of the above-described magnetic field BC that is externally applied to the magnetic memory cell 10 by the magnetic plate 3. In that sense, the magnetic field BC is hereinafter referred to as an "offset adjustment magnetic field BC". The direction of the offset magnetic field BO and the direction of the offset adjustment magnetic field BC are opposite to each other at the magnetic free layer 30. In other words, the offset magnetic field BO is countered by the offset adjustment magnetic field BC. According to the present embodiment, as described above, the offset magnetic field BO is purposely generated and further the magnetic plate 3 is provided outside the magnetic memory cell 10 in order to negate the offset magnetic field BO. It can be said that the magnetic plate 3 is used for offset compensation. Effects obtained by this structure are as follows.

Figure 4A:
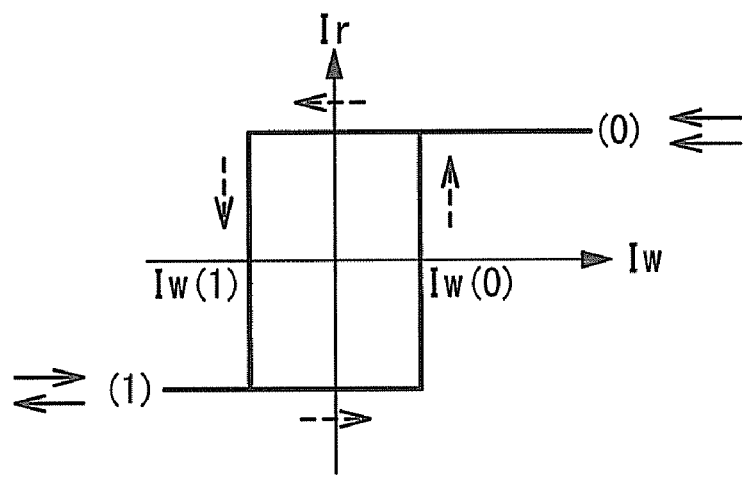
FIG. 4A is a graph showing write characteristics in a case where a magnetic plate is provided.

FIG. 4A shows write characteristics in the case where the magnetic plate 3 is provided. In FIG. 4A, the abscissa axis represents the write current Iw and the vertical axis represents the tunneling current Ir corresponding to the resistance value of the MTJ. A state of the large tunneling current Ir corresponds to the parallel state (data "0") where the resistance value of the MTJ is small. On the other hand, a state of the small tunneling current Ir corresponds to the anti-parallel state (data "1") where the resistance value of the MTJ is large. As shown in FIG. 4A, the data "0" or "1" is retained when the write current Iw does not flow. In order to rewrite data "1" to data "0", it is necessary to flow the write current Iw more than Iw(0) in a certain direction. On the other hand, in order to rewrite data "0" to data "1", it is necessary to flow the write current Iw more than Iw(1) in the opposite direction. In this manner, the data is stably retained when the write current Iw is zero.

Figure 4B:
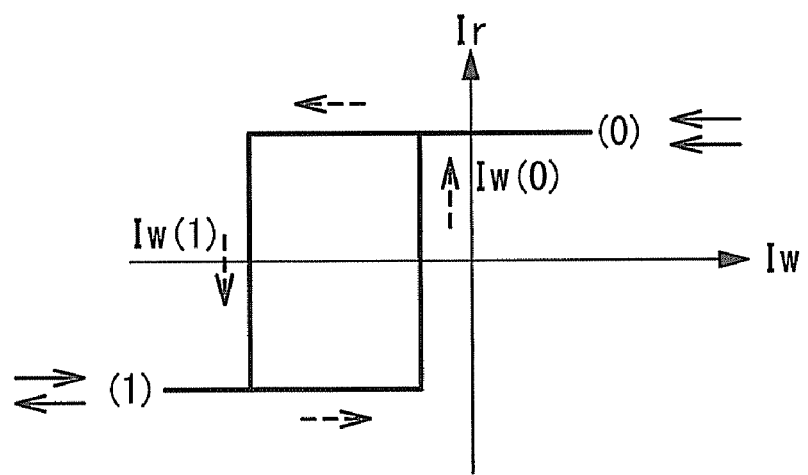
FIG. 4B is a graph showing write characteristics in a case where a magnetic plate is removed.

Whereas FIG. 4B shows write characteristics in a case where the magnetic plate 3 is removed. If the magnetic plate 3 does not exist, the offset adjustment magnetic field BC is not applied to the magnetic free layer 30 and thus the offset magnetic field BO affects the write characteristics. In the case of the above-described example, the offset magnetic field BO in the −X direction makes it difficult to switch the magnetization direction of the magnetic free layer 30 to the +X direction. In other words, an offset occurs in the write characteristics as shown in FIG. 4B. In particular, the data always becomes "0" when the write current Iw is zero. Even if data "1" is written by a large write current Iw(1), the data returns back to "0" after the supply of the write current Iw(1) stops. In this manner, when the offset adjustment magnetic field BC is removed, respective data stored in the plurality of magnetic memory cells 10 all become the same. That is to say, data retention just by magnetic bodies within the magnetic memory cells 10 is impossible or unstable. Data stored in the magnetic memory cells 10 are stabilized by the offset adjustment magnetic field BC applied from outside the magnetic memory cells 10.

A direct detection of a weak leak magnetic field from the magnetic free layer 30 of the magnetic memory cell 10 may be performed for the purpose of fraudulently stealing confidential information stored in the magnetic memory cell 10. In order to detect the weak leak magnetic field, it is necessary to peel off the magnetic plate 3 and move a magnetometer closer to the magnetic free layer 30. In this case, however, the offset adjustment magnetic field BC disappears and thus the data stored in all the magnetic memory cells 10 become the same. Therefore, the secret is kept and data theft is prevented. In this manner, according to the present embodiment, if the MRAM 1 is disassembled for the purpose of fraudulently stealing the confidential information, the data stored in the plurality of magnetic memory cells 10 are destroyed automatically. Consequently, reliability of confidentiality is improved.

In the present embodiment, the magnetic plate 3 outside the magnetic memory cells 10 plays a role of achieving the data retention in a normal operation. On the other hand, the magnetic pinned layer 20 within the magnetic memory cell 10 plays a role of destroying the data in an unusual situation. In other words, the magnetic pinned layer 20 that is usually provided within the magnetic memory cell 10 is utilized for the maintenance of confidentiality. Such a configuration is preferable since there is no need to increase components of the magnetic memory cell 10.

1-3. Circuit Configuration Example

Figure 5:
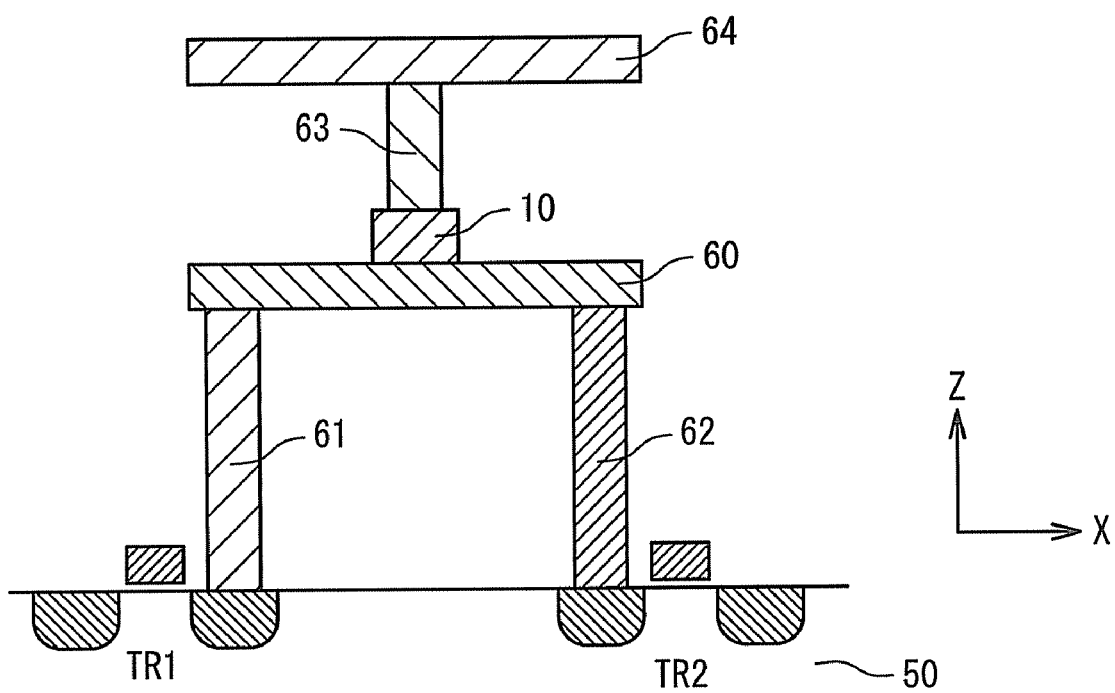
FIG. 5 is a cross-sectional view showing a circuit configuration of the MRAM according to the first embodiment of the present invention.
Figure 6:
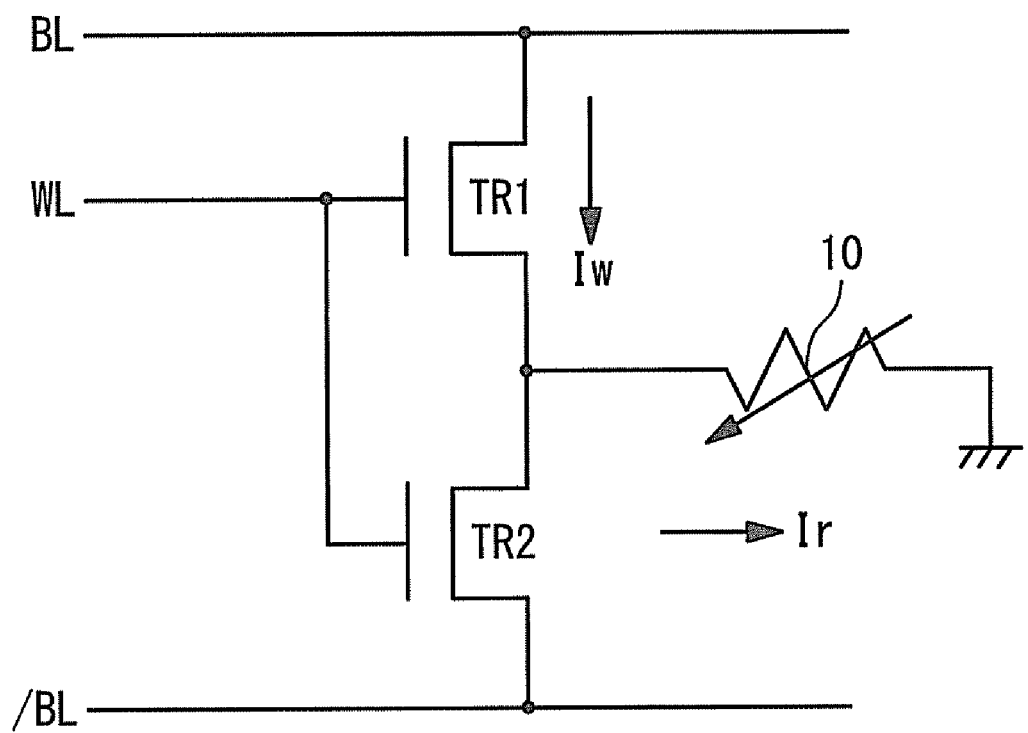
FIG. 6 is a circuit diagram showing the circuit configuration of the MRAM according to the first embodiment of the present invention.

In the present embodiment, the write characteristics are determined by a combination of magnetic bodies within the MRAM chip 2 and the magnetic plate 3 outside the MRAM chip 2. Therefore, slight tilt of the magnetic plate 3 may cause variation in the write characteristics. In a case of a widely-known asteroid method, the variation in the write characteristics leads to decrease in a write margin. It is therefore preferable in the present embodiment to employ a cell method. According to the cell method, a selection transistor is used and thereby ON/OFF control of the write current Iw is achieved with respect to each magnetic memory cell 10. FIG. 5 and FIG. 6 show an example of a circuit configuration for achieving the cell method. FIG. 5 is a cross-sectional view and FIG. 6 is an equivalent circuit diagram.

The magnetic memory cells 10 and peripheral circuits are formed on a semiconductor substrate 50. One end of the magnetic memory cell 10 (magnetoresistive element) is connected to a lower electrode 60. The lower electrode 60 is connected to selection transistors TR1 and TR2 through vias 61 and 62, respectively. Gate electrodes of the selection transistors TR1 and TR2 are connected to a word line WL. One of source/drain of the selection transistor TR1 is connected to the via 61, and the other is connected to a bit line BL of complementary bit lines (BL, /BL). One of source/drain of the selection transistor TR2 is connected to the via 62, and the other is connected to a bit line /BL of the complementary bit lines (BL, /BL). The other end of the magnetic memory cell 10 is connected to a ground electrode 64 through a via 63.

The write current Iw flows in the lower electrode 60 and generates the write magnetic field that is applied to the magnetic memory cell 10. According to this configuration, it is possible by using the word line WL and the complementary bit lines BL, /BL to supply the write current Iw such that it flows only in a lower electrode 60 associated with a selected cell. Therefore, the write magnetic field is not applied to non-selected cells and thus problems such as erroneous writing and decrease in a write margin peculiar to the asteroid method are not caused. Even if an angle or a thickness of the magnetic plate 3 varies slightly, the problems do not occur.

2. Second Embodiment

Figure 7:
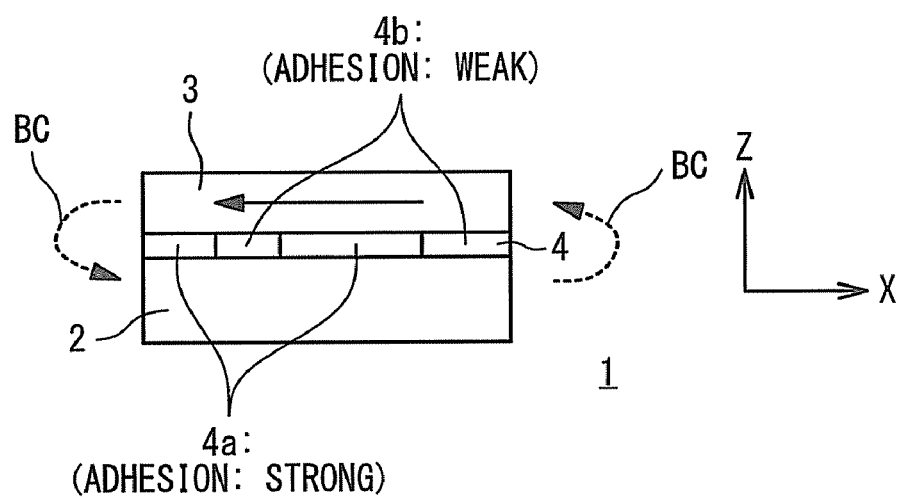
FIG. 7 is a side view showing a structure of an MRAM according to a second embodiment of the present invention.

A method that externally applies a substitute magnetic field with carefully peeling off the magnetic plate 3 may be considered. In a second embodiment, a countermeasure against such a method is proposed. FIG. 7 is a side view showing a structure of an MRAM 1 according to the second embodiment of the present invention. The same reference numerals are given to the same components as those described in the first embodiment and an overlapping description will be omitted as appropriate.

In the present embodiment, adhesion force of the adhesive layer 4 varies with position. More specifically, as shown in FIG. 7, the adhesive layer 4 includes adhesive 4a having strong adhesion force and adhesive 4b having weak adhesion force. Mechanical strength of the adhesive 4a having strong adhesion force is greater than mechanical strength of the magnetic plate 3. In this manner, the magnetic plate 3 is attached on the MRAM chip 2 (or the MRAM package) by the nonuniform adhesive layer 4.

Figure 8:
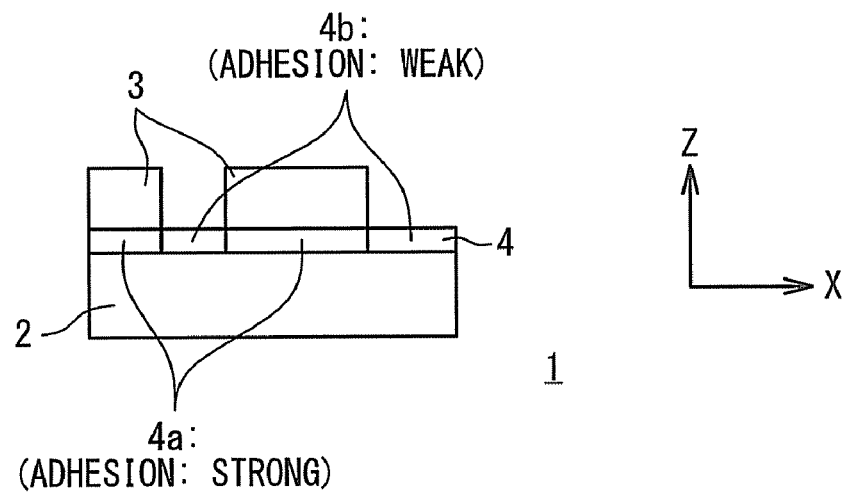
FIG. 8 is a side view showing a structure of the MRAM according to the second embodiment of the present invention.

In this case, it is difficult to uniformly peel off the magnetic plate 3. If the magnetic plate 3 is peeled off by force, only a section on the adhesive 4b is removed as shown in FIG. 8. The offset adjustment magnetic field BC by the remaining magnetic plate 3 is no longer uniform within the MRAM chip 2, which invalidates the stored data. In this manner, the safety is further improved according to the present embodiment. It should be noted that this effect can also be obtained by making mechanical strength or etching strength of the magnetic plate 3 itself nonuniform.

3. Third Embodiment

Figure 9:
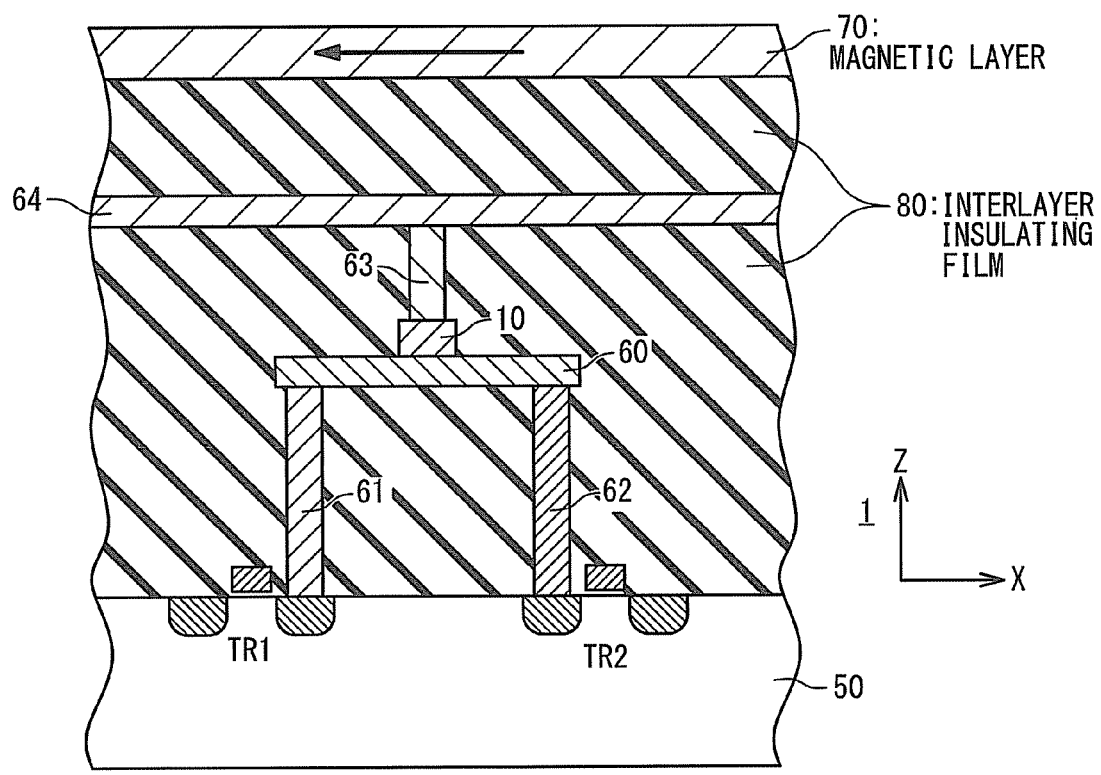
FIG. 9 is a cross-sectional view showing a structure of an MRAM according to a third embodiment of the present invention.

FIG. 9 is a cross-sectional view showing a structure of an MRAM 1 according to a third embodiment of the present invention. FIG. 9 corresponds to the foregoing FIG. 5. The same reference numerals are given to the same components as those described in the first embodiment and an overlapping description will be omitted as appropriate.

According to the present embodiment, a magnetic layer 70 instead of the magnetic plate 3 is formed within the MRAM chip 2. The magnetic layer 70 is formed in a front-end process (wafer process). More specifically, the magnetic layer 70 is formed on the plurality of magnetic memory cells 10 through an interlayer insulating film 80. In other words, the magnetic layer 70 is so formed as to overlap the plurality of magnetic memory cells 10. In FIG. 9, the magnetic layer 70 has magnetization in the −X direction. Therefore, the magnetic layer 70 uniformly applies the offset adjustment magnetic field BC in the +X direction to the plurality of magnetic memory cells 10. That is, the magnetic layer 70 also is provided for the offset compensation.

The same effects as in the first embodiment can be obtained even by this structure. Furthermore, since the magnetic layer 70 can be formed with high accuracy in the wafer process, compensation accuracy with respect to the offset magnetic field BO by the offset adjustment magnetic field BC is improved.

4. Fourth Embodiment

Figure 10:
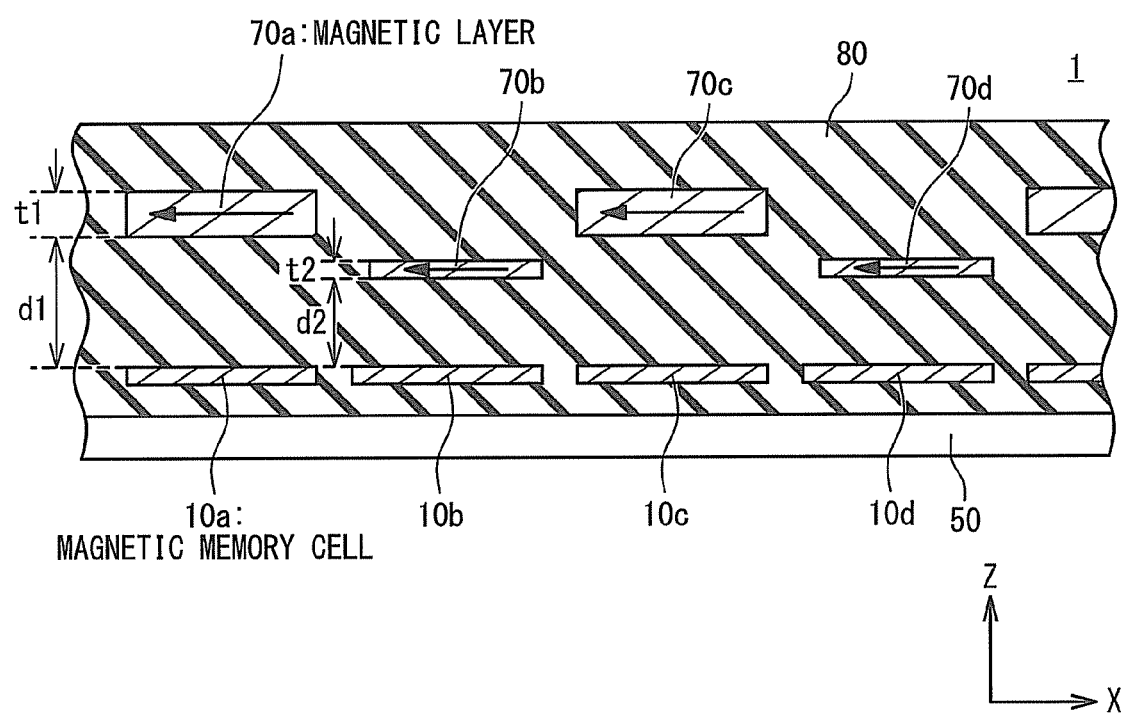
FIG. 10 is a cross-sectional view showing a structure of an MRAM according to a fourth embodiment of the present invention.

FIG. 10 is a cross-sectional view showing a structure of an MRAM 1 according to a fourth embodiment of the present invention. The same reference numerals are given to the same components as those described in the third embodiment and an overlapping description will be omitted as appropriate. For simplicity, description of peripheral parts of the magnetic memory cell 10 is omitted in FIG. 10.

In FIG. 10, a plurality of magnetic memory cells 10a, 10b, 10c and 10d are shown. Magnetic layers 70a, 70b, 70c and 70d are separately provided for the respective magnetic memory cells 10a, 10b, 10c and 10d. In other words, according to the present embodiment, a plurality of magnetic layers 70 are respectively formed on the plurality of magnetic memory cells 10 through the interlayer insulating film 80. Each magnetic layer 70 has magnetization in the −X direction and applies the offset adjustment magnetic field BC in the +X direction to the corresponding one magnetic memory cell 10. In this manner, the offset adjustment magnetic field BC by the plurality of magnetic memory cells 1 is uniformly applied to the plurality of magnetic memory cells 10. The same effects as in the third embodiment can be obtained even by this structure.

Moreover, as shown in FIG. 10, a distance between each magnetic layer 70 and the corresponding magnetic memory cell 10 may be various. For example, a distance (a thickness of the interlayer insulating film 80) d1 between the magnetic memory cell 10a and the magnetic layer 70a formed thereon is larger than a distance (a thickness of the interlayer insulating film 80) d2 between the magnetic memory cell 10b and the magnetic layer 70b formed thereon. In this case, a film thickness t1 of the magnetic layer 70a is designed to be larger than a film thickness t2 of the magnetic layer 70b, in order to uniform the magnitude of the offset adjustment magnetic field BC. In other words, the film thickness of each magnetic layer 70 is adjusted such that the offset adjustment magnetic field BC applied to the plurality of magnetic memory cells 10 becomes uniform.

In this case where the distances between the magnetic layers 70 and the magnetic memory cells 10 are different, the following effects can be obtained. That is, when a man tries to remove the magnetic layers 70 for stealing the confidential information, a part of the magnetic layers 70 is removed in first. In the case of the example shown in FIG. 10, the magnetic layers 70a and 70c are removed before the magnetic layers 70b and 70d. At a time when the part of the magnetic layers 70 is removed, the data stored in the corresponding magnetic memory cells 10 are destroyed. Since it is not possible to uniformly remove all the magnetic layers 70, the safety is further improved as in the case of the foregoing second embodiment.

Figure 11:
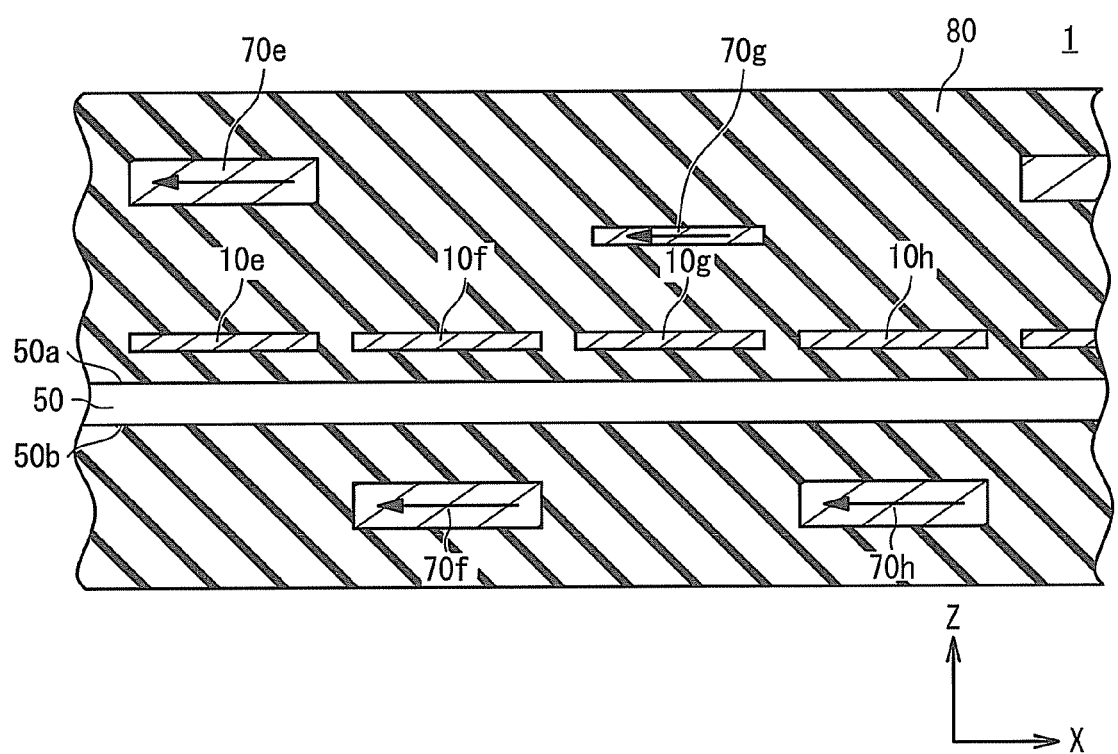
FIG. 11 is a cross-sectional view showing a modified example of an MRAM according to a fourth embodiment of the present invention.

FIG. 11 shows a modified example. In FIG. 11, a plurality of magnetic memory cells 10e, 10f, 10g and 10h are shown. Magnetic layers 70e, 70f, 70g and 70h are separately provided for the respective magnetic memory cells 10e, 10f, 10g and 10h. Here, the magnetic layers 70e and 70g are arranged on a side of a front surface 50a of the semiconductor substrate 50, while the magnetic layers 70f and 70h are arranged on a side of a rear surface 50b of the semiconductor substrate 50. That is to say, the plurality of magnetic layers 70 are dispersively arranged on the both surface sides of the semiconductor substrate 50. Thus, it is not possible to uniformly remove all the magnetic layers 70, which is effective.

5. Fifth Embodiment

In a typical USB memory drive or the like, the confidential information stored in a memory chip is often system-protected based on the number of times of erroneous password entries. In this case, there is a possibility that the memory chip itself is taken out and the confidential information is read out by supplying electric signals to the memory chip.

Figure 12:
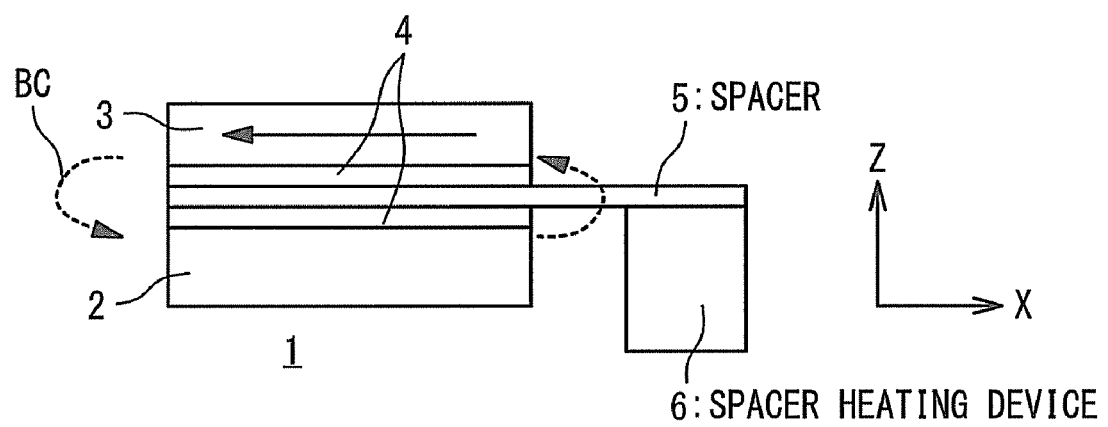
FIG. 12 is a side view showing a structure of an MRAM according to a fifth embodiment of the present invention.

FIG. 12 shows an example of a case where the MRAM 1 according to the present invention is applied to the USB memory drive or the like. The same reference numerals are given to the same components as those described in the first embodiment and an overlapping description will be omitted as appropriate. In FIG. 12, a spacer 5 is inserted into the adhesive layer 4 between the magnetic plate 3 and the MRAM chip 2. The spacer 5 is formed of shape memory alloy such as TiNi alloy. When detecting an abnormality, a spacer heating device 6 heats the spacer 5 to distort it. As a result, data stored in the MRAM chip 2 are destroyed.

6. Summary

As described above, the magnetic plate 3 or the magnetic layer 70 serves as a "magnetic field application section" that externally applies the offset adjustment magnetic field BC to the magnetic memory cells 10. If the MRAM 1 is disassembled for the purpose of data theft, the offset adjustment magnetic field BC disappears. In that case, data stored in all the magnetic memory cells 10 become the same. That is to say, the data are destroyed and confidentiality is maintained. In this manner, reliability of confidentiality is improved according to the MRAM of the present invention.

It is apparent that the present invention is not limited to the above embodiments and may be modified and changed without departing from the scope and spirit of the invention.

This application is the National Phase of PCT/JP2007/071922, filed Nov. 12, 2007, which is based upon and claims the benefit of priority from Japanese patent application No. 2006-317207, filed on Nov. 24, 2006, the disclosure of which is incorporated herein in its entirely by reference.

The invention claimed is:

1. A magnetic random access memory comprising:
    a plurality of magnetic memory cells each having a magnetoresistive element; and
    a magnetic field application section configured to apply an offset adjustment magnetic field in a certain direction to said plurality of magnetic memory cells from outside said plurality of magnetic memory cells,
    wherein respective data stored in said plurality of magnetic memory cells are the same when said offset adjustment magnetic field is removed.

2. The magnetic random access memory according to claim 1,
    wherein said magnetic field application section includes a magnetic plate attached on a chip in which said plurality of magnetic memory cells are formed, and
    wherein said magnetic plate applies said offset adjustment magnetic field to said plurality of magnetic memory cells.

3. The magnetic random access memory according to claim 2,
    wherein said magnetic plate is attached on said chip by an adhesive layer whose adhesion force varies with position.

4. The magnetic random access memory according to claim 1,
    wherein said magnetic field application section includes a magnetic plate attached on a package provided with a chip in which said plurality of magnetic memory cells are formed, and
    wherein said magnetic plate applies said offset adjustment magnetic field to said plurality of magnetic memory cells.

5. The magnetic random access memory according to claim 4,
    wherein said magnetic plate is attached on said package by an adhesive layer whose adhesion force varies with position.

6. The magnetic random access memory according to claim 1,
    wherein said magnetic field application section includes a magnetic layer that is formed on said plurality of magnetic memory cells through an interlayer insulating film, and
    wherein said magnetic layer applies said offset adjustment magnetic field to said plurality of magnetic memory cells.

7. The magnetic random access memory according to claim 1,
    wherein said magnetic field application section includes a plurality of magnetic layers that are respectively formed on said plurality of magnetic memory cells through an interlayer insulating film, and
    wherein each of said plurality of magnetic layers applies said offset adjustment magnetic field to a corresponding one of said plurality of magnetic memory cells.

8. The magnetic random access memory according to claim 7,
    wherein said plurality of magnetic layers include:
    a first magnetic layer having a first film thickness and formed on a first magnetic memory cell among said plurality of magnetic memory cells; and
    a second magnetic layer having a second film thickness smaller than said first film thickness and formed on a second magnetic memory cell among said plurality of magnetic memory cells,
    wherein a thickness of said interlayer insulating film between said first magnetic memory cell and said first magnetic layer is larger than a thickness of said interlayer insulating film between said second magnetic memory cell and said second magnetic layer.

9. The magnetic random access memory according to claim 7,
    wherein said plurality of magnetic memory cells are formed on a substrate, and said plurality of magnetic layers are arranged on both a front surface side and a rear surface side of said substrate.

10. The magnetic random access memory according to claim 1,
wherein said magnetoresistive element comprises:
a magnetic pinned layer whose magnetization direction is fixed;
a magnetic free layer whose magnetization direction is reversible; and
a nonmagnetic layer sandwiched between said magnetic pinned layer and said magnetic free layer,
wherein a leak magnetic field from said magnetic pinned layer is applied as an offset magnetic field to said magnetic free layer, and said offset magnetic field and said offset adjustment magnetic field are opposite in direction at said magnetic free layer.

11. The magnetic random access memory according to claim 10,
wherein said magnetic pinned layer comprises:
a first ferromagnetic film being in contact with said nonmagnetic layer; and
a second ferromagnetic film antiferromagnetically coupled to said first ferromagnetic film across a nonmagnetic film,
wherein a thickness of said second ferromagnetic film is larger than a thickness of said first ferromagnetic film.

* * * * *